United States Patent
Lin et al.

(10) Patent No.: US 10,204,203 B2
(45) Date of Patent: Feb. 12, 2019

(54) PATTERN-BASED POWER-AND-GROUND (PG) ROUTING AND VIA CREATION

(71) Applicant: Synopsys, Inc., Mountain View, CA (US)

(72) Inventors: Yan Lin, Pleasanton, CA (US); Yi-Min Jiang, Mountain View, CA (US); Phillip H. Tai, Mountain View, CA (US); Lin Yuan, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/849,427

(22) Filed: Mar. 22, 2013

(65) Prior Publication Data
US 2014/0189629 A1    Jul. 3, 2014

Related U.S. Application Data

(60) Provisional application No. 61/747,982, filed on Dec. 31, 2012.

(51) Int. Cl.
  *G06F 17/50* (2006.01)
(52) U.S. Cl.
  CPC .............................. *G06F 17/5077* (2013.01)
(58) Field of Classification Search
  USPC .......................................................... 716/127
  See application file for complete search history.

(56) References Cited

U.S. PATENT DOCUMENTS

| | | | |
|---|---|---|---|
| 6,388,208 B1 * | 5/2002 | Kiani et al. | 174/266 |
| 7,603,641 B2 | 10/2009 | Lin | |
| 8,219,941 B2 | 7/2012 | Sinha et al. | |
| 8,484,599 B2 | 7/2013 | Sundaresan | |
| 8,495,547 B2 | 7/2013 | Keinert et al. | |
| 2005/0281119 A1 * | 12/2005 | Shibata et al. | 365/230.06 |
| 2008/0141208 A1 * | 6/2008 | Hirota | G06F 17/5068 716/112 |
| 2010/0077373 A1 * | 3/2010 | Isomura | 716/12 |
| 2012/0223368 A1 | 9/2012 | Sherlekar et al. | |

* cited by examiner

*Primary Examiner* — Bryce M Aisaka
(74) *Attorney, Agent, or Firm* — Park, Vaughan, Fleming & Dowler LLP; Laxman Sahasrabuddhe

(57) ABSTRACT

Systems and techniques for pattern-based power-and-ground (PG) routing and via rule based via creation are described. A pattern for routing PG wires can be received. Next, an instantiation strategy may be received, wherein the instantiation strategy specifies an area of an integrated circuit (IC) design layout where PG wires based on the pattern are to be instantiated and specifies one or more net identifiers that are to be assigned to the instantiated PG wires. The PG wires can be instantiated in the IC design layout based on the pattern and the instantiation strategy. Additionally, a set of via rules can be received, wherein each via rule specifies a type of via that is to be instantiated at an intersection between two PG wires that are in two different metal layers. Next, one or more vias can be instantiated in the IC design layout based on the set of via rules.

12 Claims, 5 Drawing Sheets

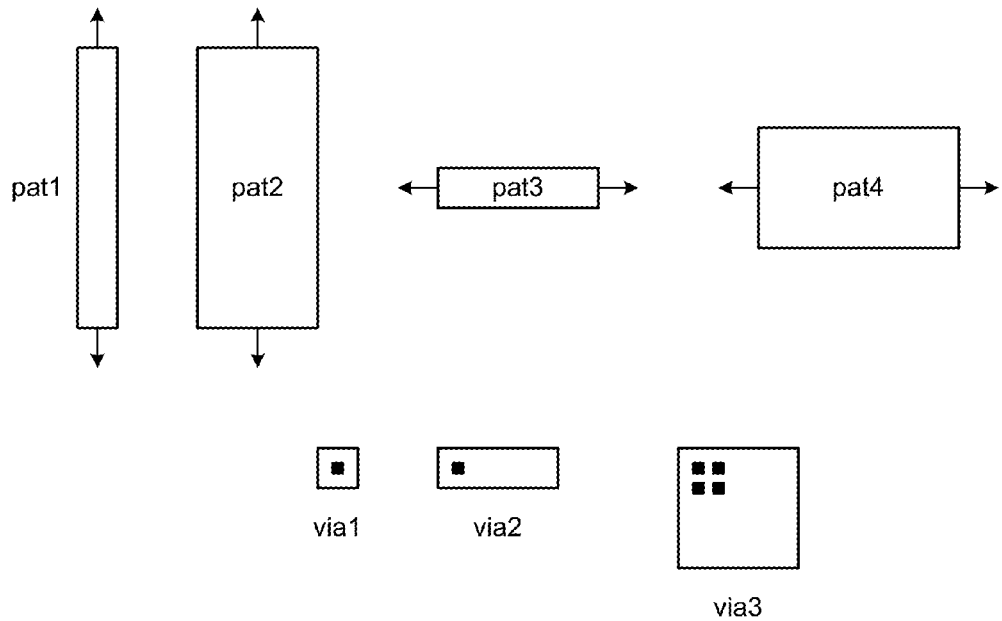
FIG. 5A
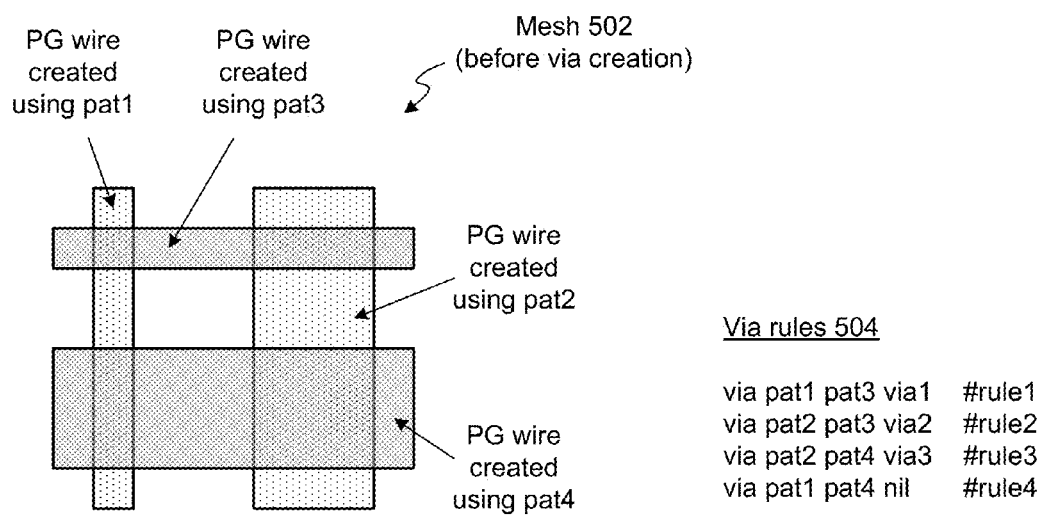
FIG. 5B
Via rules 504
via pat1 pat3 via1   #rule1
via pat2 pat3 via2   #rule2
via pat2 pat4 via3   #rule3
via pat1 pat4 nil    #rule4
FIG. 5C

PATTERN-BASED POWER-AND-GROUND (PG) ROUTING AND VIA CREATION

RELATED APPLICATION

This application claims priority to U.S. Provisional Application Ser. No. 61/747,982, by the same inventors, filed on 31 Dec. 2012, the contents of which are herein incorporated by reference in their entirety.

BACKGROUND

Technical Field

This disclosure relates to electronic design automation (EDA). More specifically, this disclosure relates to pattern-based power-and-ground routing and via creation.

Related Art

Power-and-ground (PG) nets refer to the nets in an integrated circuit that supply power and ground voltages to circuit elements. Conventional techniques typically create a PG net by individually creating and connecting a large number of wire segments. For example, conventional techniques typically create a PG net by using a script that individually creates each wire segment in the PG net, i.e., each wire segment that is created in the PG net corresponds to the execution of a command that creates a single wire segment.

Such conventional approaches have many drawbacks. In particular, the scripts that are used to create PG nets are becoming unmanageably complex due to the rapidly increasing size and complexity of circuit designs. It is not uncommon for a company to have a team of dedicated engineers for creating and maintaining these scripts. Furthermore, whenever a floorplan of a circuit design is modified, the script also usually needs to be modified. The process of modifying the script and then checking the modified script can take a long time. Due to these drawbacks conventional script-based approaches can easily add a few weeks to the total turn-around-time for modifying the circuit design floorplan.

Therefore, what are needed are systems and techniques for PG routing without the above-described problems.

SUMMARY

Some embodiments described herein provide systems and techniques for pattern-based PG routing. Specifically, a pattern for routing PG wires can be received. For example, a pattern-based PG routing application may read a file that contains a description of a pattern that is defined using a pattern definition language. Next, the embodiment may receive an instantiation strategy that specifies an area of an integrated circuit (IC) design layout where PG wires based on the pattern are to be instantiated and specifies one or more net identifiers that are to be assigned to the instantiated PG wires. The instantiation strategy can also optionally specify PG blockages (i.e., areas in the IC design where PG wires are not allowed to be routed) and any extension requirements (e.g., so that the pattern can be electrically connected to one or more existing objects in the IC design). In some embodiments, a graphical user interface can be used to create a instantiation strategy. The PG wires can then be instantiated in the IC design layout based on the pattern and the instantiation strategy.

The pattern can be a hierarchical pattern that combines a set of two or more patterns. The pattern definition language may support a set of basic patterns (e.g., line pattern, ring pattern, etc.) and provide constructs to define hierarchical patterns.

Some embodiments described herein provide systems and techniques for pattern-based via creation. Specifically, a set of via rules can be received, wherein each via rule specifies a type of via that is to be instantiated at an intersection between two PG wires that are in two different metal layers. Next, one or more vias can be instantiated in the IC design layout based on the set of via rules. The process of instantiating one or more vias can involve: (1) detecting an intersection between a first PG wire in a first metal layer and a second PG wire in a second metal layer, (2) selecting a via rule in the set of via rules based on a first pattern that was used to create the first PG wire and a second pattern that was used to create the second PG wire, and (3) instantiating a via in the IC design layout at the intersection between the first PG wire and the second PG wire according to the selected via rule.

The logic for selecting a via rule can be arbitrarily complex. In some embodiments, the most specific via rule can be selected when multiple via rules match the pattern criteria. For example, upon detecting an intersection between PG wires that were created using a first pattern and a second pattern, an embodiment can select a pattern-specific via rule in the set of via rules that matches the first and second patterns. If none of the pattern-specific via rules match the criteria, then a pattern-type-specific via rule can be selected that matches pattern types corresponding to the first and second patterns. If none of the pattern-specific via rules match the criteria and also none of the pattern-type-specific via rules match the criteria, then a default via rule can be used.

BRIEF DESCRIPTION OF THE FIGURES

FIGS. 5A-5D illustrate how via rules can be used to create vias in accordance with some embodiments described herein.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the one or more inventions disclosed herein are not limited to the embodiments shown, but are to be accorded the widest scope consistent with the principles and features disclosed herein.

Overview of an Electronic Design Automation (EDA) Flow

An EDA flow can be used to create a circuit design. Once the circuit design is finalized, it can undergo fabrication, packaging, and assembly to produce integrated circuit chips. An EDA flow can include multiple steps, and each step can involve using one or more EDA software tools. Some EDA steps and software tools are described below. These examples of EDA steps and software tools are for illustrative purposes only and are not intended to limit the embodiments to the forms disclosed.

Some EDA software tools enable circuit designers to describe the functionality that is desired to be implemented. These tools also enable circuit designers to perform what-if planning to refine functionality, check costs, etc. During logic design and functional verification, the HDL (hardware description language), e.g., SystemVerilog, code can be written and the design can be checked for functional accuracy, e.g., the design can be checked to ensure that it produces the correct outputs.

During synthesis and design for test, the HDL code can be translated to a netlist using one or more EDA software tools. Further, the netlist can be optimized for the target technology, and tests can be designed and implemented to check the finished chips. During netlist verification, the netlist can be checked for compliance with timing constraints and for correspondence with the HDL code.

During design planning, an overall floorplan for the chip can be constructed and analyzed for timing and top-level routing. During physical implementation, circuit elements can be positioned in the layout (placement) and can be electrically coupled (routing). PG routing can take place during physical implementation.

During analysis and extraction, the circuit's functionality can be verified at a transistor level and parasitics can be extracted. During physical verification, the design can be checked to ensure correctness for manufacturing, electrical issues, lithographic issues, etc.

During resolution enhancement, geometric manipulations can be performed on the layout to improve manufacturability of the design. During mask data preparation, the design can be taped-out to produce masks which are used during fabrication.

Pattern-Based PG Routing

Figure 1:
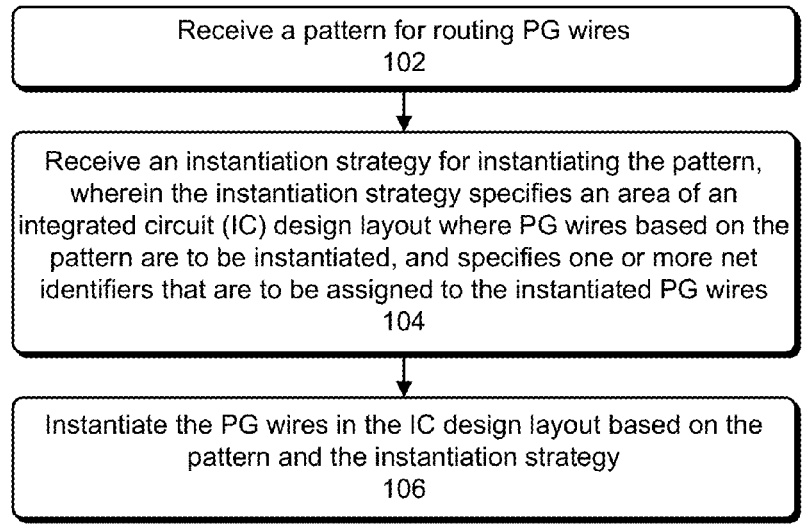
FIG. 1 presents a flowchart that illustrates a process for pattern-based PG routing in accordance with some embodiments described herein.

FIG. 1 presents a flowchart that illustrates a process for pattern-based PG routing in accordance with some embodiments described herein.

The process can begin by receiving a pattern for routing PG wires (operation 102). The pattern can be a hierarchical pattern that combines a set of two or more patterns. Specifically, the pattern can be described using a pattern definition language that allows a user to define a pattern in terms of other patterns that are natively supported by the pattern definition language or that are defined elsewhere (e.g., either in the same file or in a different file). The pattern definition language may natively support a set of basic patterns which can then be used to create more complex patterns. For example, the set of basic patterns can include a single line, a single segment, a line-and-space pattern, a ring pattern, macro/pad connection, standard cell rail, and/or any other patterns that are desired to be natively supported in the pattern definition language. The pattern definition language can provide constructs that enable a new pattern to be defined and created by combining one or more existing patterns.

This disclosure includes examples of patterns that are described using a particular pattern definition language. This pattern definition language has been used for illustration purposes only. The pattern definition examples presented in this disclosure are not intended to limit the embodiments to the forms disclosed.

In addition to the pattern, the process can also receive an instantiation strategy for instantiating the pattern, wherein the instantiation strategy includes an area of an IC design layout where PG wires based on the pattern are to be instantiated and one or more net identifiers that are to be assigned to the instantiated PG wires (operation 104). The area specified in the instantiation strategy can generally include a set of polygons in a given layer of the IC design layout. A set of PG blockages can also be specified in the instantiation strategy in addition to specifying the area where the PG wires are to be instantiated. A PG blockage can indicate one or more areas in the IC design where PG wires are not allowed to be instantiated.

The process can then instantiate the PG wires in the IC design layout based on the pattern and the instantiation strategy (operation 106). As mentioned above, if any PG blockages are specified, then the process can instantiate the PG wires in the area of the IC design layout that was specified in the instantiation strategy without violating the PG blockages (e.g., by avoiding the blocked areas) that were specified in the instantiation strategy.

Figure 2A:
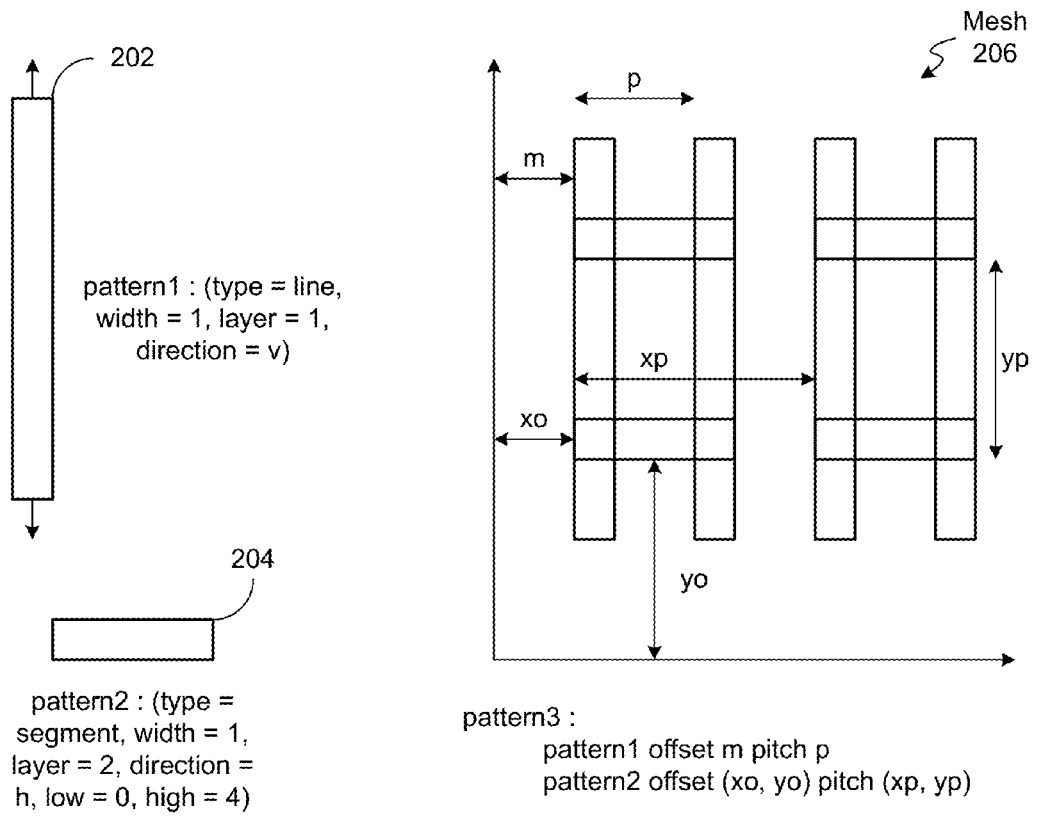
FIG. 2A illustrates examples of patterns in accordance with some embodiments described herein.

FIG. 2A illustrates examples of patterns in accordance with some embodiments described herein. The three pattern examples illustrated in FIG. 2A are called pattern1, pattern2, and pattern3. In FIG. 2A, patterns pattern1 and pattern2 are basic patterns, i.e., these patterns are natively supported in the pattern description language. Pattern pattern3, on the other hand, is a pattern that is defined in terms of patterns pattern1 and pattern2.

Pattern pattern1 is a line with the following parameters: width=1, layer=1, and direction=v ("v" means "vertical"). As shown in FIG. 2A, pattern1 can be defined using the following statement in a pattern definition language: "pattern1: (type=line, width=1, layer=1, direction=v)." Since pattern1 extends indefinitely in the vertical direction (this is illustrated in FIG. 2A by the arrows that extend out from the top and bottom edges of rectangle 202), the endpoints or length of rectangle 202 in the vertical direction is not specified.

Pattern pattern2 is a segment that can be defined using the following statement: "pattern2: (type=segment, width=1, layer=2, direction=h, low=0, high=4)." Since pattern2 is a segment, the ends of the pattern (or alternatively the length) need to be specified. The "low" value specifies the location of the left edge of rectangle 204, and the "high" value specifies the location of the right edge of rectangle 204. The direction parameter is "h," which stands for "horizontal."

Pattern pattern3 defines a mesh pattern (mesh 206 in FIG. 2A) based on patterns pattern1 and pattern2. As shown in FIG. 2A, the definition of patttern3 states that pattern3 is a combination of a repetition of pattern1 and a repetition of pattern2. The repetition of pattern1 begins at offset "m" and is repeated with pitch "p." The repetition of pattern2 begins at offset (xo, yo), and repeats with pitch "xp" in the horizontal direction and with pitch "yp" in the vertical direction. Since the lines corresponding to pattern1 extend indefinitely in the vertical direction, the offset and pitch in the vertical direction are not specified for pattern1.

The syntax and semantics of the pattern definition language shown in FIG. 2A is for illustration purposes only and is not intended to limit the embodiments to the forms disclosed. Many modifications and variations will be apparent to those skilled in the art. For example, instead of specifying the layer information in the pattern definition (e.g., the parameter assignment "layer=1" in pattern1's definition), the layer information may be specified when a pattern is instantiated.

Figure 2B:
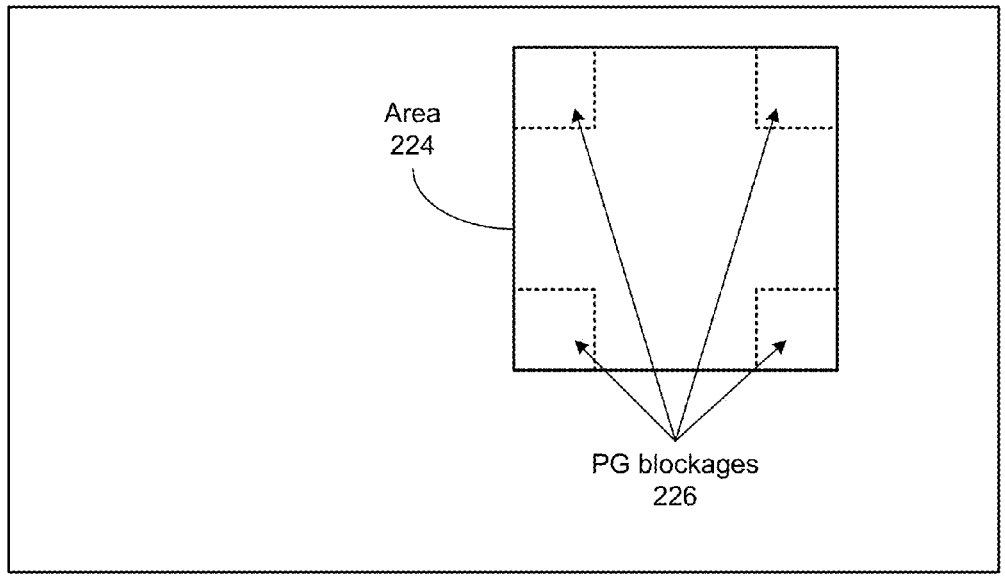
FIG. 2B illustrates an instantiation strategy for instantiating a pattern in accordance with some embodiments described herein.

FIG. 2B illustrates an instantiation strategy for instantiating a pattern in accordance with some embodiments described herein. The instantiation strategy can specify area 224 in IC design layout 222 for instantiating a PG pattern and can specify that net identifier "n123" be assigned to the instantiated wires. In general, multiple net identifiers can be specified in an instantiation strategy. For example, the instantiation strategy may specify that horizontal wires be assigned net identifier "n1" and vertical wires be assigned net identifier "n2." PG blockages 226 can also be specified in the instantiation strategy, wherein PG blockages 226 are to be avoided while instantiating a PG pattern. PG blockages can generally be located anywhere in IC design layout 222, and a PG blockage may apply to one or more layers.

Figure 2C:
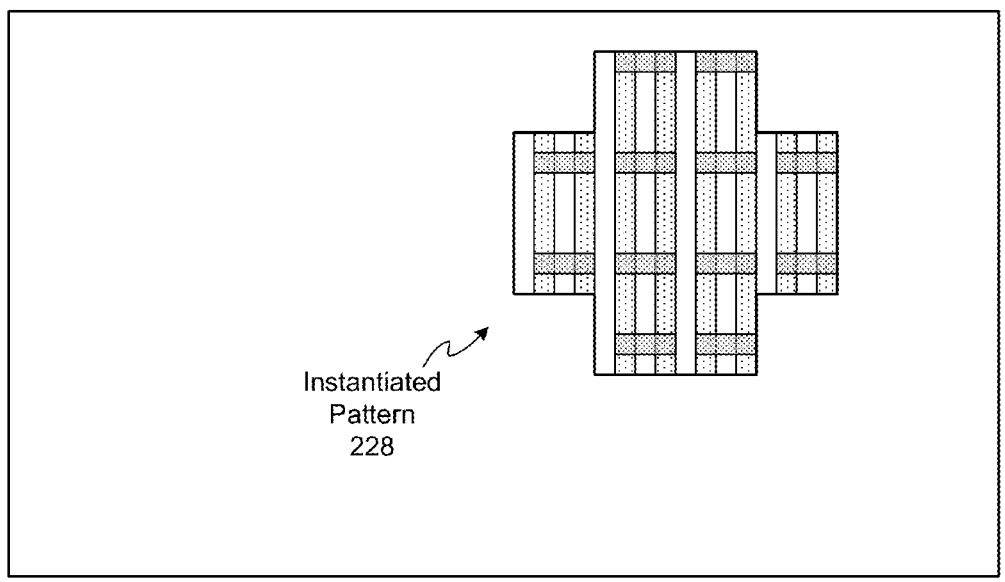
FIG. 2C illustrates how a pattern can be instantiated in a given area without violating PG blockages in accordance with some embodiments described herein.

FIG. 2C illustrates how a pattern can be instantiated in a given area without violating PG blockages in accordance with some embodiments described herein. Instantiated pattern 228 in FIG. 2C is obtained when pattern3 shown in FIG. 2A is instantiated in area 224 shown in FIG. 2B while avoiding PG blockages 226 shown in FIG. 2B. The wires of instantiated pattern 228 are assigned net identifier "n123" (not shown in FIG. 2C) as was specified in the instantiation strategy. Note that pattern1 is on layer 1, and pattern2 is on layer 2. Therefore, the vertical lines in instantiated pattern 228 are on layer 1, and the horizontal segments in instantiated pattern 228 are on layer 2. In some embodiments, the instantiation strategy can also specify how the wires in instantiated pattern 228 are to be extended. For example, an instantiation strategy may specific that one or more wires are to be extended so that the wires electrically connect one or more objects in IC design layout 222. The pattern-based PG routing tool may select one or more wires in instantiated pattern 228 (e.g., based on the location of the objects that need to be electrically connected), and then extend the selected wires in the appropriate direction (i.e., so that the extended wires electrically connect the objects that were specified in the instantiation strategy).

Figure 3:
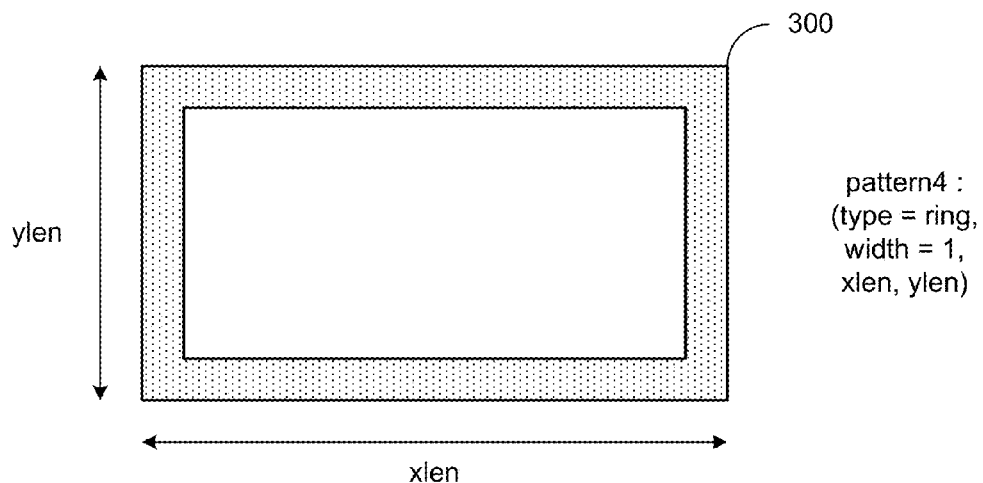
FIG. 3 illustrates a ring pattern in accordance with some embodiments described herein.

The pattern examples shown in FIG. 2A are for illustration purposes only, and are not intended to limit the embodiments described herein. Many variations and modifications to the illustrative examples disclosed herein will be apparent to those skilled in the art. For example, FIG. 3 illustrates a ring pattern in accordance with some embodiments described herein. As shown in FIG. 3, a ring pattern can be defined using the following statement: "pattern4: (type=ring, width=1, xlen, ylen)." The parameter assignment "type=ring" indicates that the pattern is a ring pattern. Next, the parameter assignment "width=1" specifies the width of the ring (i.e., the width of the shaded area in FIG. 3). The parameter "xlen" and "ylen" specify the dimensions of the ring as shown in FIG. 3.

When different patterns are instantiated on different layers (e.g., pattern1 on metal layer M1, pattern2 on metal layer M2, etc.), vias may need to be created to electrically connect the different patterns. A process for creating vias based on via rules is now described.

Via Rules

Figure 4:
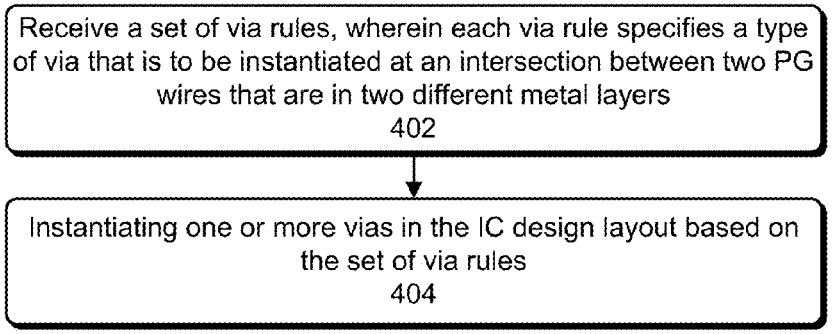
FIG. 4 presents a flowchart that illustrates a process for creating vias based on via rules in accordance with some embodiments described herein.

FIG. 4 presents a flowchart that illustrates a process for creating vias based on via rules in accordance with some embodiments described herein. The process can begin with receiving a set of via rules, wherein each via rule specifies a type of via that is to be instantiated at an intersection between two PG wires that are in two different metal layers (operation 402). Next, one or more vias can be instantiated in the IC design layout based on the set of via rules (operation 404).

Instantiating one or more vias can include the following operations: (1) detecting an intersection between a first PG wire in a first metal layer and a second PG wire in a second metal layer, (2) selecting a via rule in the set of via rules based on a first pattern that was used to create the first PG wire and a second pattern that was used to create the second PG wire, and (3) instantiating a via in the IC design layout at the intersection between the first PG wire and the second PG wire based on the via rule.

A via rule can be specified at the pattern level (this type of via rule is called a "pattern-specific via rule" in this disclosure) or at the pattern-type level (this type of via rule is called a "pattern-type-specific via rule" in this disclosure). A pattern-specific via rule specifies two patterns (e.g., pattern1 and pattern2). The pattern-specific via rule can instantiate a via at the intersection between two PG wires that were created by the two patterns specified in the pattern-specific via rule. For example, if a pattern-specific via rule specifies patterns pattern1 and pattern2, then the via rule can instantiate a via at the intersection of a PG wire created by pattern1 in layer 1 and a PG wire created by pattern2 in layer 2. A pattern-type-specific via rule specifies two pattern-types (e.g., pattern-type "line" and pattern-type "ring"), and is used to create a via at the intersection between two PG wires that were created by two patterns belonging to the two pattern-types. For example, a pattern-type-specific via rule can be used to create a via at the intersection of a PG wire that was created by a line pattern and a PG wire that was created by a ring pattern.

If multiple via rules match the criteria for an intersection, then the process may select the most specific via rule or select a via rule that has the highest priority (assuming that the via rules have been assigned priorities). For example, suppose a pattern-specific via rule R1 states that a via is to be created at the intersection between PG wires that were created by patterns P1 and P2. Let patterns P1 and P2 belong to pattern types T1 and T2, respectively. Further, suppose a pattern-type-specific via rule R2 states that a via is to be created at the intersection between PG wires that were created by patterns of pattern types T1 and T2. In this example, both R1 and R2 would be applicable to an intersection between PG wires that were created using patterns P1 and P2. In some embodiments, since via rule R1 is more specific than via rule R2, the process may select via rule R1 for creating the via.

In some embodiments, each via rule may be associated with a priority, and the matching via rule with the highest priority may be selected for creating the via. If none of the via rules match an intersection, then the process may use a default via rule to create the via (assuming a default via rule has been defined).

Specifically, in some embodiments, the process for selecting a via rule for an intersection between two PG wires that were created using a first and second pattern may be stated as follows: (1) select a pattern-specific via rule in the set of via rules that matches the first and second patterns, (2) if a pattern-specific via rule cannot be selected, then select a pattern-type-specific via rule in the set of via rules that matches pattern types corresponding to the first and second patterns, and (3) if a pattern-specific via rule or a pattern-type-specific via rule cannot be selected, select a default via rule (assuming a default rule has been defined). These techniques for selecting a via rule have been presented for illustration purposes only and are not intended to limit the embodiments to the forms disclosed.

Figure 5D:
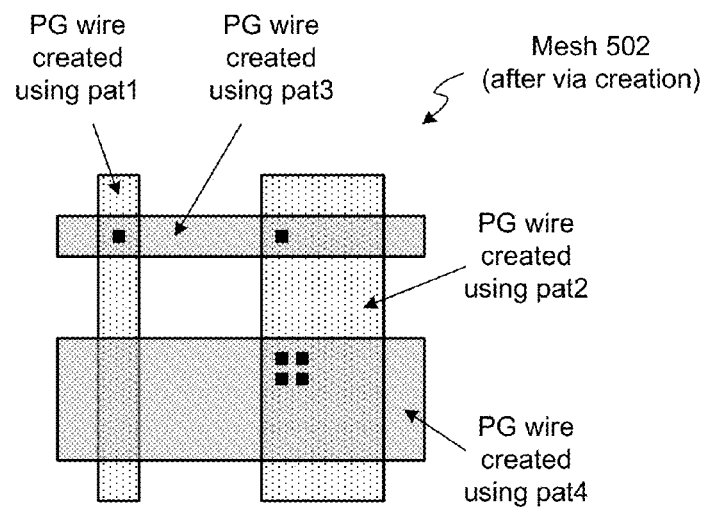

FIGS. 5A-5D illustrate how via rules can be used to create vias in accordance with some embodiments described herein. FIG. 5A illustrates four different patterns (pat1, pat2, pat3, and pat4) and three different vias (via1, via2, and via3). Patterns pat1 and pat2 are vertical lines on layer 1, wherein the width of pattern pat2 is greater than the width of pattern pat1. Patterns pat3 and pat4 are horizontal lines on layer 2, wherein the width of pattern pat4 is greater than the width of pattern pat3. As shown in FIG. 5A, a single via at the center of the intersecting region is created in via1, a single via on the left end of the intersecting region is created in via2, and a 2×2 via array at the top left corner of the intersecting region is created in via3.

FIG. 5B illustrates a mesh pattern (mesh 502) that has been created using patterns pat1, pat2, pat3, and pat4 (e.g., mesh 502 may be created by specifying offset and pitch values for each of the patterns). Note that no vias have been created in FIG. 5B.

FIG. 5C illustrates a set of via rules that can be used to create vias in mesh 502. Specifically, via rules 504 include four via rules. The first via rule states that a via of type via1 is to be created when two PG wires created by patterns pat1 and pat3 intersect. The second via rule states that a via of type via2 is to be created when two PG wires created by patterns pat2 and pat3 intersect. The third via rule states that a via of type via3 is to be created when two PG wires created by patterns pat2 and pat4 intersect. The fourth via rule states that no vias are to be created when two PG wires created by patterns pat1 and pat4 intersect.

FIG. 5D illustrates the result of applying via rules 504 to mesh 502. As shown in FIG. 5D, the first via rule was used for the top-left intersection, the second via rule was used for the top-right intersection, the third via rule was used for the bottom-right intersection, and the fourth via rule was used for the bottom-left intersection.

Computer System

Figure 6:
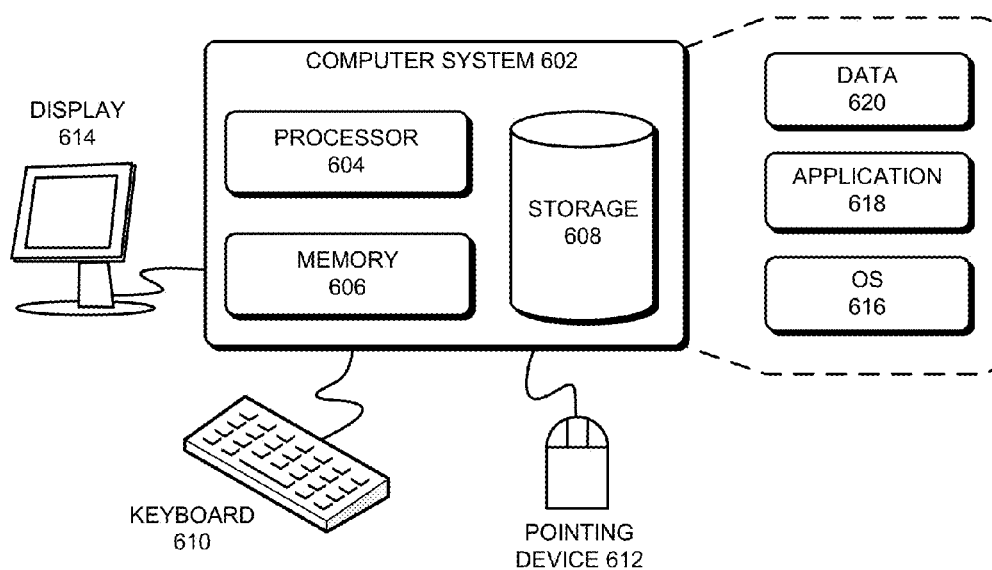
FIG. 6 illustrates a computer system in accordance with some embodiments described in this disclosure.

FIG. 6 illustrates a computer system in accordance with some embodiments described in this disclosure. Computer system 602 can include processor 604, memory 606, and storage device 608. Computer system 602 can be coupled to display device 614, keyboard 610, and pointing device 612. Storage device 608 can store operating system 616, application 618, and data 620. Data 620 can include input required by application 618 and/or output generated by application 618.

Computer system 602 may automatically (or with user input) perform one or more processes that are implicitly or explicitly described in this disclosure. For example, computer system 602 can load application 618 into memory 606, and application 618 can then be used to perform pattern-based PG routing and/or via creation based on a set of via rules. The following table illustrates a runtime and memory comparison between the traditional approach and the new approach described herein.

| Design | Run Time | | Tcl Command # | |
| --- | --- | --- | --- | --- |
| | Traditional | New | Traditional | New |
| Design 1 | 68.5 min | 22.5 min (3X) | 1022 | 19 (54X) |
| Design 2 | 618 min | 44 min (14X) | 867 | 15 (57X) |
| Design 3 | 14 min | 3.5 min (4.2X) | 332 | 12 (27X) |
| Design 4 | 38 sec | 4 sec (9.5X) | 95 | 14 (6X) |
| Average | | 7.7X | | 36X |

CONCLUSION

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for pattern-based power-and-ground (PG) routing in an integrated circuit (IC) design, the method comprising:
  detecting an intersection between a first PG wire in a first metal layer and a second PG wire in a second metal layer in an integrated circuit (IC) design layout;

determining that the first PG wire was created using a first pattern, wherein the first pattern is named using a first identifier;

determining that the second PG wire was created using a second pattern, wherein the second pattern is named using a second identifier;

selecting, by using a computer, a via rule from a set of via rules based on matching the first identifier and the second identifier with pairs of identifiers specified in each via rule, wherein the via rule specifies a count and layout of vias; and creating one or more vias in the IC design at the intersection between the first PG wire in the first metal layer and the second PG wire in the second metal layer based on the via rule.

2. The method of claim 1, wherein each pattern is described using a pattern definition language, and wherein each pattern specifies at least a shape, size, or relative location of one or more PG wires.

3. The method of claim 1, wherein said selecting the via rule further includes, responsive to determining that the first and second identifiers did not match any pairs of identifiers, matching a first pattern type corresponding to the first pattern and a second pattern type corresponding to the second pattern with pairs of pattern types specified in the set of via rules.

4. The method of claim 3, wherein selecting the via rule further includes, responsive to determining that the first and second pattern types did not match any pairs of pattern types, selecting a default via rule.

5. A non-transitory computer-readable storage medium storing instructions that, when executed by a computer, cause the computer to perform a method for pattern-based power-and-ground (PG) routing in an integrated circuit (IC) design, the method comprising:

detecting an intersection between a first PG wire in a first metal layer and a second PG wire in a second metal layer in an integrated circuit (IC) design layout;

determining that the first PG wire was created using a first pattern, wherein the first pattern is named using a first identifier;

determining that the second PG wire was created using a second pattern, wherein the second pattern is named using a second identifier;

selecting, by using a computer, a via rule from a set of via rules based on matching the first identifier and the second identifier with pairs of identifiers specified in each via rule, wherein the via rule specifies a count and layout of vias; and creating one or more vias in the IC design at the intersection between the first PG wire in the first metal layer and the second PG wire in the second metal layer based on the via rule.

6. The non-transitory computer-readable storage medium of claim 5, wherein each pattern is described using a pattern definition language, and wherein each pattern specifies at least a shape, size, or relative location of one or more PG wires.

7. The non-transitory computer-readable storage medium of claim 5, wherein said selecting the via rule further includes, responsive to determining that the first and second identifiers did not match any pairs of identifiers, matching a first pattern type corresponding to the first pattern and a second pattern type corresponding to the second pattern with pairs of pattern types specified in the set of via rules.

8. The non-transitory computer-readable storage medium of claim 7, wherein selecting the via rule further includes, responsive to determining that the first and second pattern types did not match any pairs of pattern types, selecting a default via rule.

9. An apparatus, comprising:
a processor; and
a non-transitory computer-readable storage medium storing instructions that, when executed by the processor, cause the apparatus to perform a method for pattern-based power-and-ground (PG) routing in an integrated circuit (IC) design, the method comprising:

detecting an intersection between a first PG wire in a first metal layer and a second PG wire in a second metal layer in an integrated circuit (IC) design layout;

determining that the first PG wire was created using a first pattern, wherein the first pattern is named using a first identifier;

determining that the second PG wire was created using a second pattern, wherein the second pattern is named using a second identifier;

selecting, by using a computer, a via rule from a set of via rules based on matching the first identifier and the second identifier with pairs of identifiers specified in each via rule, wherein the via rule specifies a count and layout of vias; and creating one or more vias in the IC design at the intersection between the first PG wire in the first metal layer and the second PG wire in the second metal layer based on the via rule.

10. The apparatus of claim 9, wherein each pattern is described using a pattern definition language, and wherein each pattern specifies at least a shape, size, or relative location of one or more PG wires.

11. The apparatus of claim 9, wherein said selecting the via rule further includes, responsive to determining that the first and second identifiers did not match any pairs of identifiers, matching a first pattern type corresponding to the first pattern and a second pattern type corresponding to the second pattern with pairs of pattern types specified in the set of via rules.

12. The apparatus of claim 11, wherein selecting the via rule further includes, responsive to determining that the first and second pattern types did not match any pairs of pattern types, selecting a default via rule.

* * * * *